United States Patent
Mazur et al.

[11] Patent Number: 6,150,832
[45] Date of Patent: Nov. 21, 2000

[54] NONCONTACT CAPACITANCE MEASURING DEVICE

[75] Inventors: Robert G. Mazur, Sewickley; Robert J. Hillard, Avalon, both of Pa.

[73] Assignee: Solid State Measurements, Inc., Pittsburgh, Pa.

[21] Appl. No.: 09/273,190

[22] Filed: Mar. 19, 1999

Related U.S. Application Data

[60] Provisional application No. 60/079,614, Mar. 27, 1998.

[51] Int. Cl.[7] .............................. G01R 31/26; G01R 27/26
[52] U.S. Cl. ......................... 324/765; 324/686; 324/758
[58] Field of Search ...................... 324/754, 758, 324/765, 658, 661, 687, 686, 679, 660, 688, 662, 690; 33/556, 561, 558; 250/306, 307

[56] References Cited

U.S. PATENT DOCUMENTS

| | | | |
|---|---|---|---|
| 4,498,043 | 2/1985 | Heathcote et al. | 324/662 |
| 4,769,919 | 9/1988 | Lloyd et al. | 33/558 |
| 5,036,271 | 7/1991 | Mazur et al. | 324/758 |
| 5,140,272 | 8/1992 | Nishimatsu et al. | 324/662 |
| 5,225,690 | 7/1993 | Sakai et al. | 250/559.09 |
| 5,233,291 | 8/1993 | Kouno et al. | 324/765 |
| 6,037,781 | 3/2000 | Kono et al. | 324/537 |
| 6,075,375 | 6/2000 | Burkhart et al. | 324/758 |

OTHER PUBLICATIONS

P.K. Hansma et al., "Scanning Tunneling Microscopy and Atomic Force Microscopy: Application to Biology and Technology," Oct. 14, 1988, pp. 209–216.

"Standard Test Method for Characterization of Metal–Oxide–Silicon (MOS) Structures by Capacitance–Voltage Measurements," ASTM Designation: F 1153–92, pp. 382–388 (Date Unavailable).

R. Hillard "Section 3.1b Capacitance–Voltage Measurement," Solid State Measurements, Jun. 12, 1997, pp. 129–148.

*Primary Examiner*—Safet Metjahic.
*Assistant Examiner*—Russell M. Kobert
*Attorney, Agent, or Firm*—Webb Ziesenheim Logsdon Orkin & Hanson, P.C.

[57] ABSTRACT

An apparatus for conducting noncontact capacitance versus voltage measurements over a flat surface of a test wafer comprises a capacitance measuring head mounted on a positioning arm. The positioning arm is kinematically mounted and positions the measuring head over the test wafer. The capacitance measuring head has a plurality of electrically separate capacitor plates, one for use in making the capacitance versus voltage measurements and the remaining plates for providing capacitive position signals. Actuators responsive to the position signals place the measuring head very close to and substantially parallel to the surface of the test wafer.

8 Claims, 3 Drawing Sheets

SECTION B-B

SECTION C-C

NONCONTACT CAPACITANCE MEASURING DEVICE

RELATED APPLICATION

The benefits of U.S. Provisional Patent Application Serial No. 60/079,614, filed Mar. 27, 1998 are hereby claimed for this application.

BACKGROUND OF THE INVENTION

Measurements of capacitance versus an applied DC voltage (CV measurements) are essential in controlling the processes used in making integrated circuits. These measurements are most commonly done on silicon wafers covered with a high quality oxide or other insulating material as the dielectric needed for MOS (metal oxide semiconductor) devices. The purpose of these CV measurements is to control the electrical properties of both the dielectric material and the underlying silicon wafer.

A specific device for making CV measurements utilizing a mercury column contact supported by a kinematically-stable probe arm is described in U.S. Pat. No. 5,036,271.

More generally, these CV measurements have been made using fabricated MOSCAPS (MOS capacitors) involving a deposited metal or polysilicon gate material as the upper plate of a test MOS diode (ASTM F1153-92). While such fabricated MOSCAP measurements have proven useful, there are a number of serious problems with this approach:

1) the process used in fabricating the MOS diodes uses a series of photolithographic steps and is therefore time consuming (typically one to two weeks);
2) the MOS diode fabrication process is costly—involving a need for extra processing equipment, materials (expensive metals and chemicals) and extra labor. In addition, there is a significant cost due to lost device throughput as production equipment must often wait for CV test results;
3) there is a loss of wafer throughput due to the need to have a monitor wafer specifically fabricated with MOS test diodes for test purposes; and
4) the material properties being measured may be affected by the processing needed to fabricate the test MOS diode structures.

Therefore, there has for some years been an increasing interest in test techniques that do not require fabrication of test MOS diodes. In particular, several noncontact CV test methods have been developed to avoid the negative aspects of the conventional fabricated MOS diode approach. See, for example, U.S. Pat. No. 5,233,291. However, achieving parallelism of the face of the measuring head and test wafer is very time consuming in the prior noncontact techniques.

The most often used of these noncontact techniques depends on placement of a conductive plate a small distance above the surface of a bare or dielectric-coated wafer. If the air gap thickness is small enough (less than 1 micron), the series capacitance associated with the air gap is large enough that the silicon, oxide, etc. capacitance components may be studied via CV measurements.

Typically, if the air gap is in the range of 0.35 micron to 0.8 micron, the voltage drop across the semiconductor or dielectric-on-semiconductor structure, while only a small fraction of the total applied voltage, is sufficient to allow measurement of a number of the most useful silicon and dielectric properties.

In the case of bare silicon wafers, these noncontact techniques are restricted to very near surface profiling of relatively high resistivity silicon wafers (above about 1 ohm cm material).

However, for dielectric-coated MOS wafers, noncontact CV methods are very sensitive to total oxide charge. Total oxide charge is related to the quality of critical process conditions, such as annealing, furnace leaks, ionic and metallic contamination and oxide stoichiometry. Noncontact CV can also be done on oxidized or dielectric-coated wafers in such a way that these measurements yield complete information on several critical oxide charge components. Thus, the application of noncontact CV is very useful in MOS device process control.

The accuracy and sensitivity of the noncontact capacitance measurements depend upon the distance between the measuring capacitor plate and the wafer surface (the closer the better) and on positioning the capacitor plate precisely parallel to the surface.

SUMMARY OF THE INVENTION

Briefly, according to this invention, there is provided a capacitance measuring head having a flat sensing surface positioned very close to and precisely parallel to the flat surface of a test wafer. The measuring head comprises a plurality of electrically separate electrode plates, one for use in making the capacitance versus voltage measurements and the remaining for sensing: 1) the average distance of all the electrode plates above the surface of the test wafer, and 2) the distance of each of the several electrode plates on the measuring head above the surface of the test wafer. Associated circuitry then generates position signals indicative of both the average electrode plate distance and the distances between each of the separate electrode plates and the test wafer. The measuring head is supported by a positioning arm. Actuators responsive to the position signals control the movement of the positioning arm to position the sensing surface of the measuring head very close to and substantially parallel to the surface of the test wafer.

According to a preferred embodiment, there is provided an apparatus for conducting noncontact capacitance measurements over a flat surface of a test wafer. The apparatus comprises a base, a stand rising from the base and a positioning table alongside the stand for holding the test wafer. A capacitance measuring head is supported by pivotally mounted elongate positioning arm for positioning the measuring head over the positioning table. A kinematic support mounts the positioning arm to the stand. The kinematic support comprises first and second parts (one of which may be integral with the positioning arm) and two insulated balls therebetween. The first part has a V-groove and a trihedral hollow for receiving the balls and the second part comprises ball fixtures such that when the two balls are placed between the first and second parts of the kinematic support, one resting in the V-groove and one resting in the trihedral hollow, they are aligned on a working axis perpendicular to the longitudinal axis of the positioning arm and form a five-point support allowing the arm only one degree of freedom, that being rotation about the working axis perpendicular to the longitudinal axis of the arm. A stop extends from the stand for contacting an extension of the arm preferably on the side of the working axis away from the capacitance measuring head. An actuator adjusts the point of contact of the stop relative to the base.

An actuator adjusts the position of one ball of the kinematic support to adjust the rotation around the longitudinal axis of the arm of the first part of the kinematic support relative to the second part.

Actuators responsive to the position signals control the ball, the kinematic support, and stop positions to place the sensing surface of the measuring head very close to and substantially parallel to the surface of the test wafer.

It is an advantage of this invention to use a capacitor plate array that maximizes the efficiency and, therefore, the speed of locating the measuring capacitor plate as required relative to the test wafer.

It is an advantage, according to this invention, to rapidly and accurately position a measuring head that incorporates the measuring capacitor plate very close to and precisely parallel to the surface of the test wafer for capacitance measurements.

It is an advantage of this invention that it will potentially eliminate the monitor wafer.

It is a further object, according to this invention, to mount the capacitance measuring head on the end of a kinematically supported positioning arm above a test wafer surface and to use capacitance signals from the measuring head in a feedback loop to control servomechanisms that position the measuring head with a minimum of actuators (due to the kinematic nature of the measuring head positioning arm).

It is a still further object of this invention to use the capacitance signals to control piezoelectric or similar actuators to position the measuring head precisely parallel to a test wafer surface.

It is a still further object of this invention to use a position reference for the positioning arm in the Z direction. This position reference will be set after the Z position of the test wafer surface is initially located. The position reference will then indicate a starting Z position that will enable a decrease in the time and effort required to position the measuring head in all subsequent measurements on a particular wafer.

It is a still further object of this invention to make an accurate measurement of the test wafer's bulk dopant density. This is accomplished through the use of a light source having an appropriate wavelength to generate minority carriers in the wafer at the appropriate time in the CV measurement process.

It is a still further object of this invention to provide a mechanism that searches, locates, and qualifies prospective sites for subsequent measurement by the CV measuring head. This search and inspection process is achieved in parallel with the CV measurement of the previous site. Prospective sites are qualified to avoid unacceptable particulates or other defects that would interfere with the capacitance measurements.

BRIEF DESCRIPTION OF THE DRAWINGS

Further features and other objects and advantages of the invention will become clear from the following detailed description made with reference to the drawings in which.

DETAILED DESCRIPTION OF THE PREFERRED EMBODIMENTS

Figure 1A:
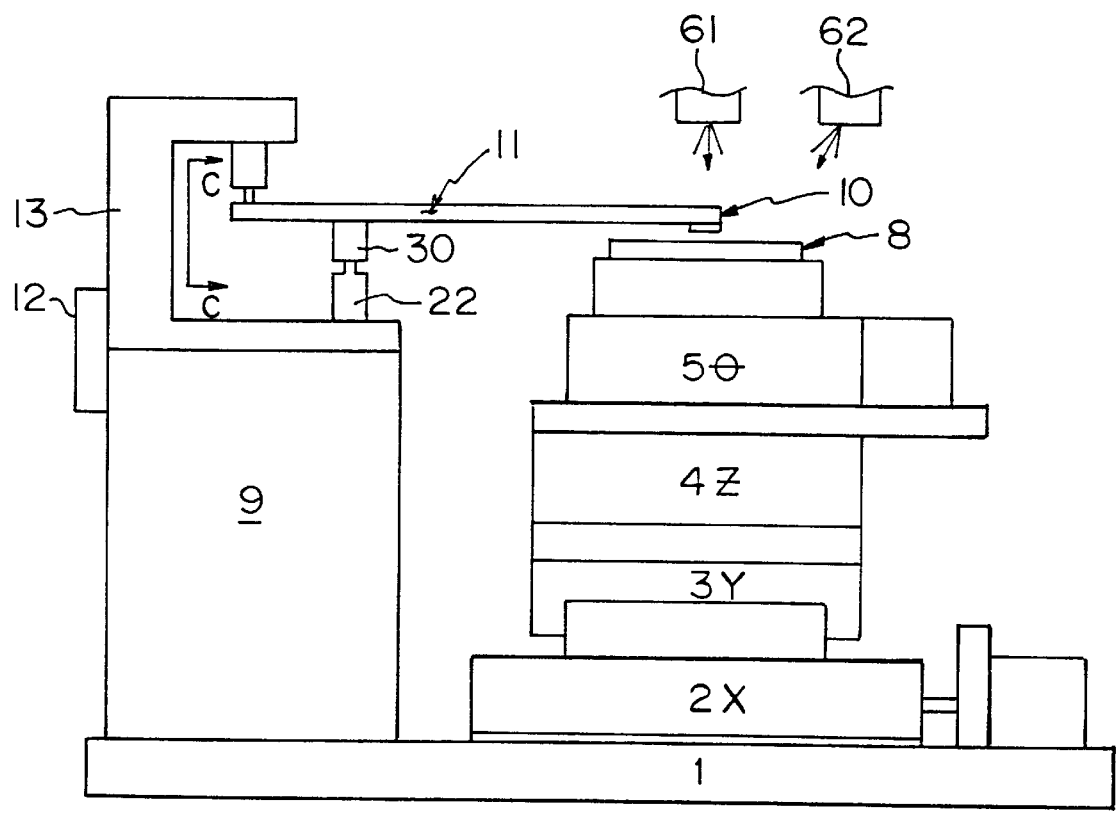
FIGS. 1a, 1b and 1c illustrate a kinematically mounted positioning arm with a capacitance measuring head and apparatus for positioning the capacitance measuring head just above (within less than 1 micron) and very closely parallel to the surface of a wafer being tested.

Referring now to FIG. 1a, mounted on a base 1 is a positioning table with X-Y-Z-theta micropositioning stages (2–5 inclusive) on which a test wafer 8 is mounted and properly positioned in the X-, Y-, Z- and theta-directions. The X, Y, and theta motions on the positioning table are designed to move the test wafer 8 relative to the capacitance measuring head 10 in the horizontal plane both to provide wafer load/unload capability (away from the measuring head) and to move from one measurement site to another on the test wafer surface; the theta motion is intended to maintain proper orientation between the measuring head and a wafer flat or notch or other fiduciary marks on the wafer surface, e.g., lines indicating test regions interspersed between other areas containing product devices or other test regions. The Z-axis stage 4 is used primarily for coarse adjustment of the vertical position of the surface of the wafer being tested; this vertical adjustment is used to: a) put the surface of the wafer being tested within just a few microns (e.g., less than ten microns) of the desired position relative to the capacitance measuring head; b) to compensate for wafers of differing diameters and, hence, thicknesses; and c) to increase the distance between the capacitance measuring head and the test wafer during high speed movement to a new measurement site on the wafer.

FIG. 1a also shows a stand 9 affixed to the base 1 and supporting the mounting and positioning apparatus for the kinematic positioning arm 11 on which is mounted the capacitance measuring head 10. This stand 9 includes a manual positioning apparatus 12 (dovetail mount) for making a coarse vertical adjustment of the upper part 13 of the stand 9 relative to the base 1 along with a mechanism for locking this coarse adjustment so as to provide a fixed, solid mounting surface for the several positioners that are mounted thereon to support and place the positioning arm 11 in a specific relationship to the test wafer surface.

Figure 1B:
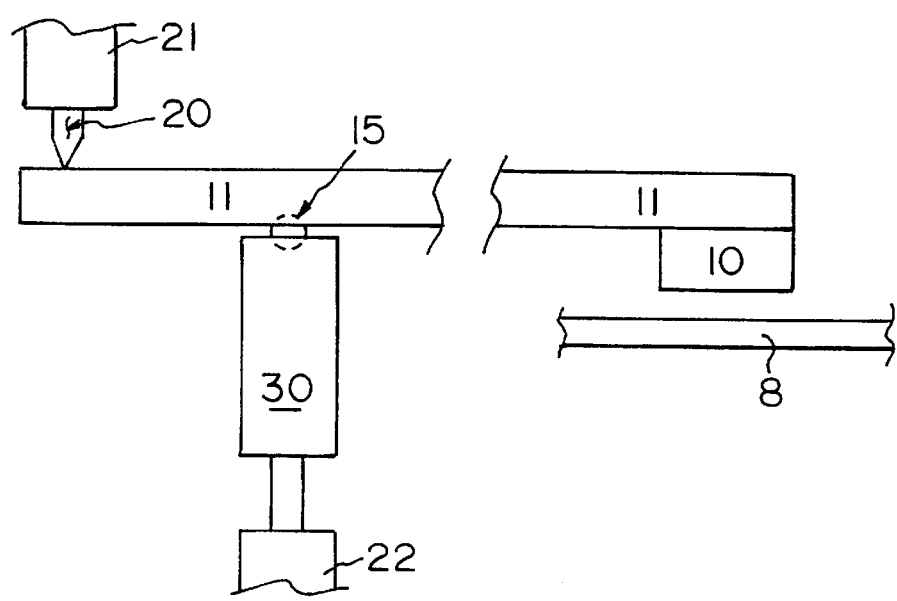
Figure 1C:
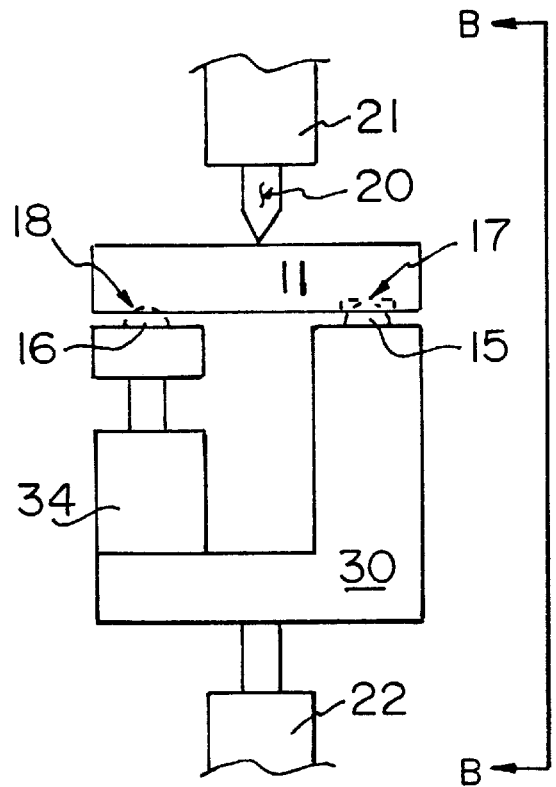

FIGS. 1a, 1b and 1c also show the mounting apparatus of the kinematically mounted positioning arm 11. This apparatus is detailed in FIGS. 1b and 1c. The positioning arm 11 with the attached capacitance measuring head 10 forms a rigid body that will be fixed in space when properly contacted by a set of six point-contacts. In this apparatus, the two balls 15 and 16 make contact to a V-groove 17 and a trihedral hollow 18 that are formed in the body of the arm 11 and are disposed along a working axis that is perpendicular to the longitudinal axis of the positioning arm. This arrangement of five point-contacts eliminates five degrees-of-freedom of the arm relative to the rest of the apparatus with the remaining degree-of-freedom being a rotation of the arm about the working axis running through the centers of the two balls. The balls are preferably made of electrically insulating material. This remaining degree-of-freedom is removed by a sixth point-contact made to the positioning arm 11 by a pin 20 that is mounted on a first Z-axis linear actuator 21 and by the force of gravity bearing downward along the longer part of the arm 11 (to the right of the axis of rotation as seen in FIGS. 1a and 1b).

Again, referring to FIGS. 1b and 1c, a second Z-axis linear actuator 22 is mounted on the upper part 13 of the stand 9 and raises and lowers the bearing assembly 30 of the positioning arm 11. Raising and lowering the pin 20, using the first Z-axis linear actuator 21 along with the second Z-axis linear actuator 22 controls the longitudinal parallelism between the capacitor plate array 32 and the surface of the test wafer 8. In addition, the third Z-axis linear actuator 34 raises and lowers one of the balls 16 relative to the other ball 15; this then controls the parallelism of the capacitor plate array 32 to the test wafer surface in the direction at right angles to the longitudinal axis of the positioning arm 11. Note then that simultaneous adjustment of only three linear actuators 21, 22, and 34 provides a system for making the surface of the capacitor plate array 32 precisely parallel to the surface of the test wafer 8.

Figure 2:
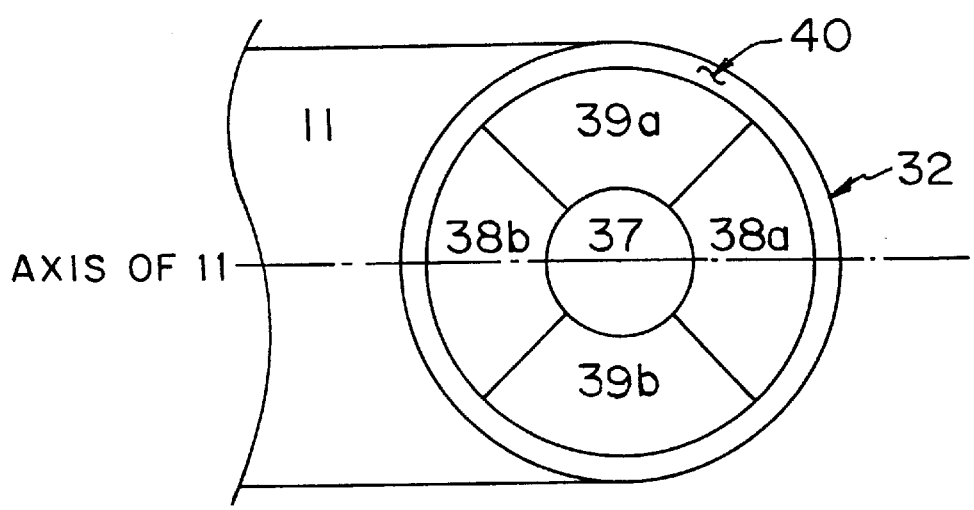
FIG. 2 illustrates a preferred arrangement of capacitor plates on the sensing surface of the capacitance measuring head.

The measuring head 10 has a flat face which is positioned parallel to the surface of the wafer 8 and very close to the surface without contacting the surface. The face is shown in FIG. 2 to have multiple (e.g., at least five) flat capacitor plates spaced thereon. Capacitor plate 37 at the center is used for the capacitance versus voltage measurements. An even number, four or more, capacitor plates, for example, 38a, 38b, 39a, 39b are positioned symmetrically around the center capacitor plate 37. Preferably, the spaces separating plates 38a, 38b, 39a and 39b are misaligned by the quotient of 180 degrees divided by the number of capacitor plates (e.g., for four plates: 80 degrees divided by four plates equals 45 degrees of misalignment) with the longitudinal axis of the positioning arm 11 as shown in FIG. 2. Less preferably, spaces separating the capacitor plates 38a, 38b, 39a and 39b are aligned with the longitudinal axis of the positioning arm 11 and perpendicular to the longitudinal axis of the arm 11. As will be explained, the capacitor plate pairs 38a, 38b and 39a, 39b are used to adjust the face 32 of the measuring head 10 to be parallel with the surface of the test wafer 8 to adjust the distance between the face 32 and the surface. Preferably, a grounded annular plate 40 is positioned outside of the electrode plate pairs 38a, 38b and 39a, 39b to provide electrostatic shielding.

During testing, the face 32 of the measuring head 10 is brought close to the surface of the test wafer 8 by coarse adjustment of the Z-direction positioning stage 4 and by fine adjustment of linear actuators 22 and 21. Capacitance measurements are then begun using well-known circuits with the capacitor plate pairs 38a, 38b and 39a, 39b.

Figure 3:
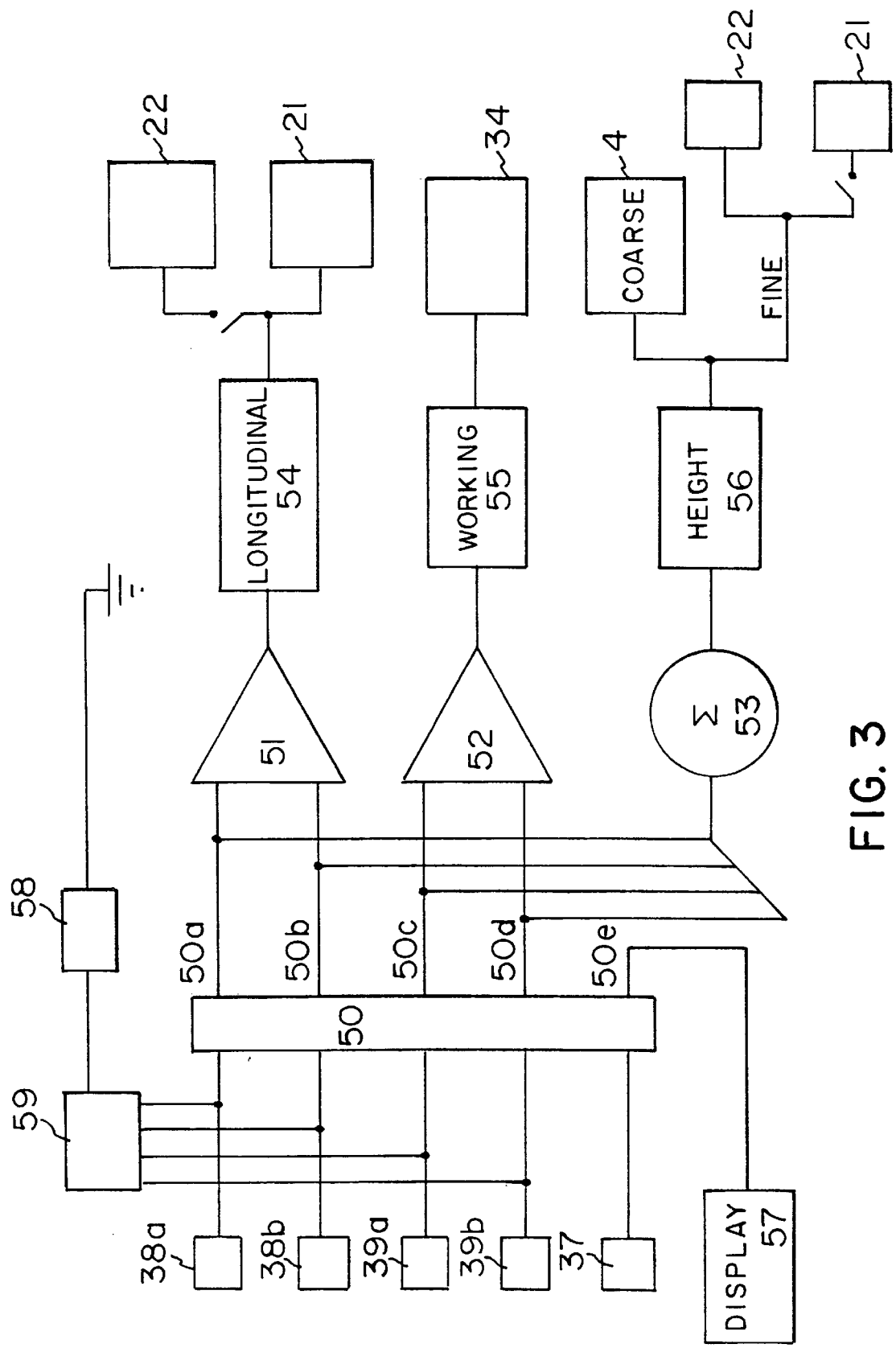
FIG. 3 schematically illustrates the electrical connections and servo loops needed to allow precise positioning of the measuring head above the test wafer surface.

FIG. 3 illustrates schematically a control circuit for using the capacitance measurements made with the capacitor plate pairs 38a, 38b and 39a, 39b to position the measuring head over the surface of the test wafer 8. A bias voltage is applied to some group of the capacitor plates in the array 32, for example, 38a, 38b and 39a, 39b to drive the semiconductor wafer surface below these plates into what is known as the accumulation mode. In this mode, capacitance measurements made using the biased group of capacitor plates are insensitive to the properties of the wafer and are predominantly dependent on the thickness of the air gap. The capacitor plate pairs are individually connected to a standard capacitance measuring circuit 50. This circuit 50 may have four or more channels for producing capacitance measurements simultaneously from each electrode on the head or may multiplex inputs for sequentially making capacitance measurements. The four outputs 50a, 50b, 50c, and 50d are combined in two comparator circuits 51, 52 and an adder circuit 53. The difference between the capacitance measurements made with capacitor plate pair 38a, 38b is detected by comparator circuit 51. The difference is scaled by circuit 54 to produce a longitudinal adjustment signal. The difference between the capacitance measurements made with capacitor plate pair 39a, 39b is detected by comparator circuit 52. The difference is scaled by circuit 55 to produce a working axis adjustment signal. All of the capacitance outputs are summed at 53 and scaled at 56 to produce, first, a Z-stage coarse height adjustment signal to 4 and, second, a fine height adjustment signal to linear actuators 22 and 21. These signals are then used to control the height of the head 10 over the surface of the wafer 8 and to control parallelism between the capacitor plate array and the wafer surface.

The capacitance difference between the paired capacitor plates 39a, 39b is used to measure the rotation of the positioning arm and the attached capacitor plate array around the longitudinal axis relative to the surface of the wafer 8 and to provide a feedback signal for control of linear actuator 34. The capacitance difference between the pair of plates 38a, 38b is used to measure the rotation of the capacitor plate array around the working axis and to provide a feedback signal for control of linear actuators 22 and 21.

The scaling that is illustrated by blocks 54, 55, and 56 on FIG. 3 may be carried out by a digital computer after the capacitance signals are digitized. The computer outputs for driving the various actuators may be converted to analog signals by an analog-to-digital converter.

Once the measuring head is properly positioned and oriented, the capacitance measuring circuit is used with capacitor plate 37 only to measure and display a capacitance versus voltage curve which is presented at 57.

In a preferred embodiment, all capacitor plates other than 37 should be biased by switch 59 and bias voltage source 58 during capacitance versus voltage measurements to create an accumulated semiconductor surface below, thus forming a guard ring structure that reduces perimeter effects.

FIG. 1a also illustrates a highly preferred embodiment. During testing by the electrode plate 37, a light source 61, for example, a red LED, illuminates the wafer by passing light through or underneath the face 32 of the measuring head. This illumination generates minority carriers in the wafer during the inversion phase of the CV measurement. Such generation of carriers enables accurate measurements of the wafer's bulk dopant density.

After the first measurement of the wafer 8 is made, the initial position of the linear actuators 21, 34, 4 and 22 are stored by the control system. During the subsequent CV measurement, these actuators will initially be returned to approximately the stored positions to return the capacitor plate array close to the previous position taking care not to contact the wafer surface. This will allow quicker measurement of subsequent CV curves.

Prior to high speed movement of the stage to position the wafer 8 at a new measurement location, the Z-height position actuators 22 and/or 21 will be used to lift the measuring head. The Z-stage 4 will also be lowered to ensure damage-free movement of the wafer. Once the wafer is positioned under the measuring head 10 for the next measurement, the Z-stage 4 will then be returned to the initial position over the wafer 8 and actuators 22 and/or 21 will be used to lower the measuring head.

Preferably, while the measuring head 10 measures the current site, sensor 62 will scan the next site to be measured. This sensor 62 will qualify the next site for unacceptable particulates or other defects. In this way, the capacitance versus voltage measuring head 10 will only be located over qualified, acceptable measurement sites.

The reference to oxide charge herein should also be understood to apply to the use of any dielectric in MOS or MIS devices.

Having thus described our invention with the detail and particularity required by the Pat. Laws, what is desired protected by Letters Patent is set forth in the following claims.

We claim:

1. An apparatus for conducting noncontact capacitance versus voltage measurements over a flat surface of a test wafer comprising:

a base and stand rising from the base;

a positioning table for holding said test wafer, said positioning table mounted relative to said base alongside said stand;

a capacitance measuring head and positioning arm for positioning the measuring head over said positioning table, said arm having a longitudinal axis;

a kinematic support for the positioning arm, said kinematic support comprising first and second parts and two insulated balls therebetween, the first part having a V-groove and a trihedral hollow for receiving the balls and the second part comprising a ball fixture such that when the two balls are placed between the first and second parts of the kinematic support, one resting in the V-groove and one resting in the trihedral hollow, they are aligned on a working axis perpendicular to the longitudinal axis of the positioning arm and form a five point support allowing the positioning arm only one degree-of-freedom, that being rotation about the working axis of the arm;

stop means extending from said stand for contacting an extension of said positioning arm, and means for adjusting the point of contact of the stop relative to said base;

means for adjusting the rotation around the longitudinal axis of the arm of the first part of the kinematic support relative to the second part;

the capacitance measuring head having a flat sensing surface capable of being positioned very close to and substantially parallel to the flat surface of the test wafer, said sensing surface having a plurality of electrically separate capacitor plates, one for use in making the capacitance versus voltage measurements and the remaining plates for providing capacitive position signals; and control means responsive to the position signals for controlling the movement of the adjusting means to position the sensing surface of the measuring head very close to and substantially parallel to the surface of the test wafer.

2. The apparatus according to claim 1, wherein at least one of the adjusting means comprises a piezoelectric linear actuator.

3. The apparatus according to claim 2, wherein both balls can be simultaneously positioned by an adjusting means comprising a piezoelectric linear actuator.

4. The apparatus according to claim 1, wherein the capacitor plates comprise five or more plates, a first plate for making the capacitance versus voltage measurements and the other four or more having identical shapes and being symmetrically arranged around the first plate.

5. The apparatus according to claim 4, wherein the first plate has a circular periphery.

6. The apparatus according to claim 1, wherein the positioning table has X-Y-Z and theta motions.

7. The apparatus according to claim 1, wherein a light source is positioned to illuminate the wafer underneath the measuring head.

8. The apparatus according to claim 1, further comprising a site-scanning sensor positioned to scan the site next to be measured to qualify said site as free of unacceptable particulates or defects.

* * * * *

UNITED STATES PATENT AND TRADEMARK OFFICE
CERTIFICATE OF CORRECTION

PATENT NO. : 6,150,832
DATED : November 21, 2000
INVENTOR(S) : Robert G. Mazur

Page 1 of 1

It is certified that error appears in the above-identified patent and that said Letters Patent is hereby corrected as shown below:

Column 2,
Line 41, after "supported by" insert -- a --.

Column 5,
Line 15, "80 degrees" should read -- 180 degrees --.

Column 6,
Line 57, "Pat. Laws" should read -- Patent Laws --.

Signed and Sealed this

Twenty-fifth Day of September, 2001

Attest:

NICHOLAS P. GODICI
Attesting Officer
Acting Director of the United States Patent and Trademark Office

UNITED STATES PATENT AND TRADEMARK OFFICE
CERTIFICATE OF CORRECTION

PATENT NO.   : 6,150,832
DATED        : November 21, 2000
INVENTOR(S)  : Robert G. Mazur It is certified that error appears in the above-identified patent and that said Letters Patent is hereby corrected as shown below:

Column 2,
Line 41, after "supported by" insert -- a --.

Column 5,
Line 15, "80 degrees" should read -- 180 degrees --.

Column 6,
Line 57, "Pat. Laws" should read -- Patent Laws --.

Signed and Sealed this

Nineteenth Day of October, 2004

JON W. DUDAS
*Director of the United States Patent and Trademark Office*